(12) United States Patent
Chen et al.

(10) Patent No.: US 8,904,317 B2
(45) Date of Patent: Dec. 2, 2014

(54) PARAMETER SETTING CIRCUIT AND METHOD FOR INTEGRATED CIRCUITS

(75) Inventors: Isaac Y. Chen, Hsinchu County (TW); Jo-Yu Wang, New Taipei (TW)

(73) Assignee: Richtek Technology Corp., Hsinchu (TW)

( * ) Notice: Subject to any disclaimer, the term of this patent is extended or adjusted under 35 U.S.C. 154(b) by 687 days.

(21) Appl. No.: 13/093,070

(22) Filed: Apr. 25, 2011

(65) Prior Publication Data

US 2011/0267128 A1     Nov. 3, 2011

(30) Foreign Application Priority Data

Apr. 28, 2010   (TW) ............................ 99113529 A

(51) Int. Cl.
  *G06F 17/50*       (2006.01)
  *H03K 19/003*      (2006.01)

(52) U.S. Cl.
  CPC .................. *H03K 19/00369* (2013.01)
  USPC ........................................................ 716/100

(58) Field of Classification Search
  USPC .......................................................... 716/100
  See application file for complete search history.

(56) References Cited

U.S. PATENT DOCUMENTS

2007/0290729 A1*  12/2007  Chen ............................ 327/172
2009/0304135 A1*  12/2009  Suzuki et al. ................. 375/354
2010/0208502 A1*   8/2010  Horii ............................ 363/131

* cited by examiner

*Primary Examiner* — Vuthe Siek
*Assistant Examiner* — Mohammed Alam
(74) *Attorney, Agent, or Firm* — Muncy, Geissler, Olds & Lowe, P.C.

(57) ABSTRACT

A parameter setting circuit and method for an integrated circuit apply a pulse current to a pin of the integrated circuit during a programming mode of the integrated circuit, and then extract the difference between the voltage on the pin and the DC component of the voltage on the pin to determine a setting signal for parameter setting to an internal circuit of the integrated circuit. By this way, an input pin, an output pin or an input/output pin of the integrated circuit may be used as the pin implementing the parameter setting function.

19 Claims, 11 Drawing Sheets

PARAMETER SETTING CIRCUIT AND METHOD FOR INTEGRATED CIRCUITS

FIELD OF THE INVENTION

The present invention is related generally to a parameter setting circuit and method for integrated circuits (ICs) and, more particularly, to a circuit and method for setting an internal parameter of an IC by a present pin of the IC.

BACKGROUND OF THE INVENTION

For low pin count package products, the internal parameter setting is a tough topic. Multi-function pin is famous to adopt to solve this issue, especially for eight pin single buck pulse width modulation (PWM) controller and even package with pin count less then eight. For example, FIG. 1 is the pin configuration of Richtek Technology Corporation's product no. RT8015 whose internal circuit is shown in FIG. 2, in which a power IC 10 has eight pins that all have been occupied by specific functions and thus there is no pin available for parameter setting to the internal compensation circuit 12 from external. In consequence, the power IC 10 is limited in applications. FIG. 3 is the pin configuration of uPI Semiconductor Corporation's product no. uP6103, in which a power IC 20 also has eight pins without any vacant one for customers to set the parameter of the internal compensation circuit from external.

Therefore, it is desired a circuit and method to combine input, output or input/output with internal parameter setting at a same pin of an IC.

SUMMARY OF THE INVENTION

An objective of the present invention is to provide a parameter setting circuit for ICs.

Another objective of the present invention is to provide a parameter setting method for ICs.

According to the present invention, a parameter setting circuit for an integrated circuit includes a current pulse generator, a DC extractor, a difference extractor and a parameter controller. During a programming mode of the integrated circuit, the current pulse generator applies a pulse current to a pin of the integrated circuit, the DC extractor extracts the DC component of the voltage on the pin to generate a first signal, the difference extractor extracts the difference between the voltage on the pin and the first signal to generate a second signal, and the parameter controller determines a setting signal responsive to the second signal for parameter setting to an internal circuit of the integrated circuit.

According to the present invention, during a programming mode of an integrated circuit, a parameter setting method applies a pulse current to a pin of the integrated circuit which is connected with a programming device outside the integrated circuit, and then extracts the difference between the voltage on the pin and the DC component of the voltage on the pin to determine a setting signal for parameter setting to an internal circuit of the integrated circuit.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figures 1, 3:
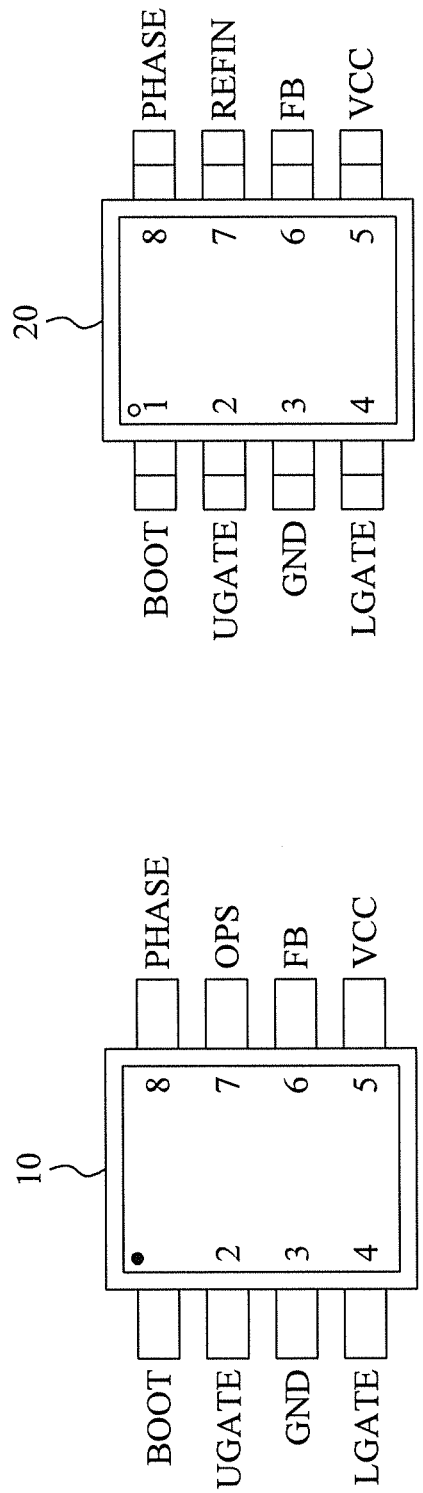
FIG. 1 is the pin configuration of a commercial power IC.
FIG. 3 is the pin configuration of another commercial power IC.
Figure 2:
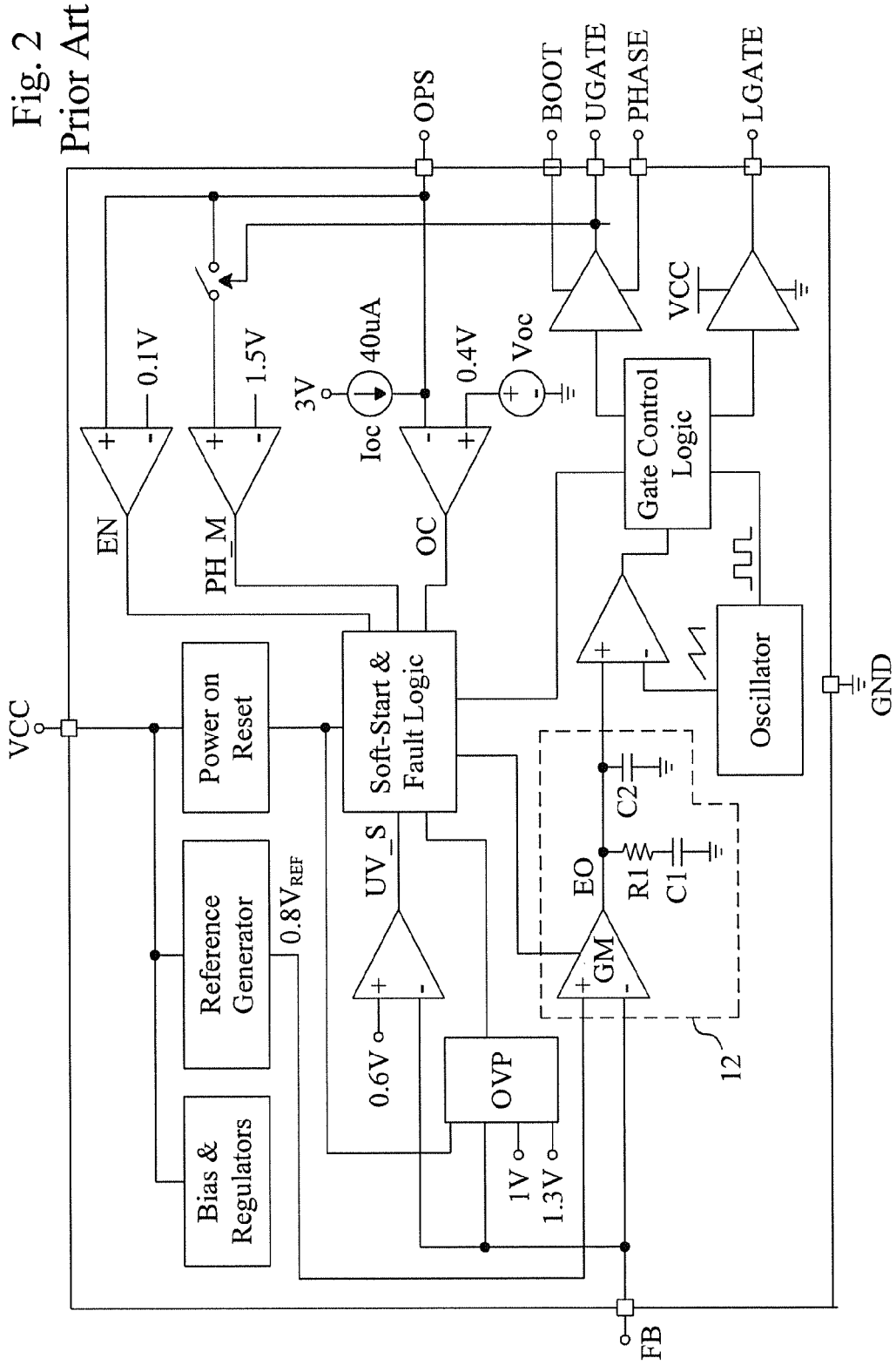
FIG. 2 is the internal circuit of the power IC shown in FIG. 1.
Figure 4:
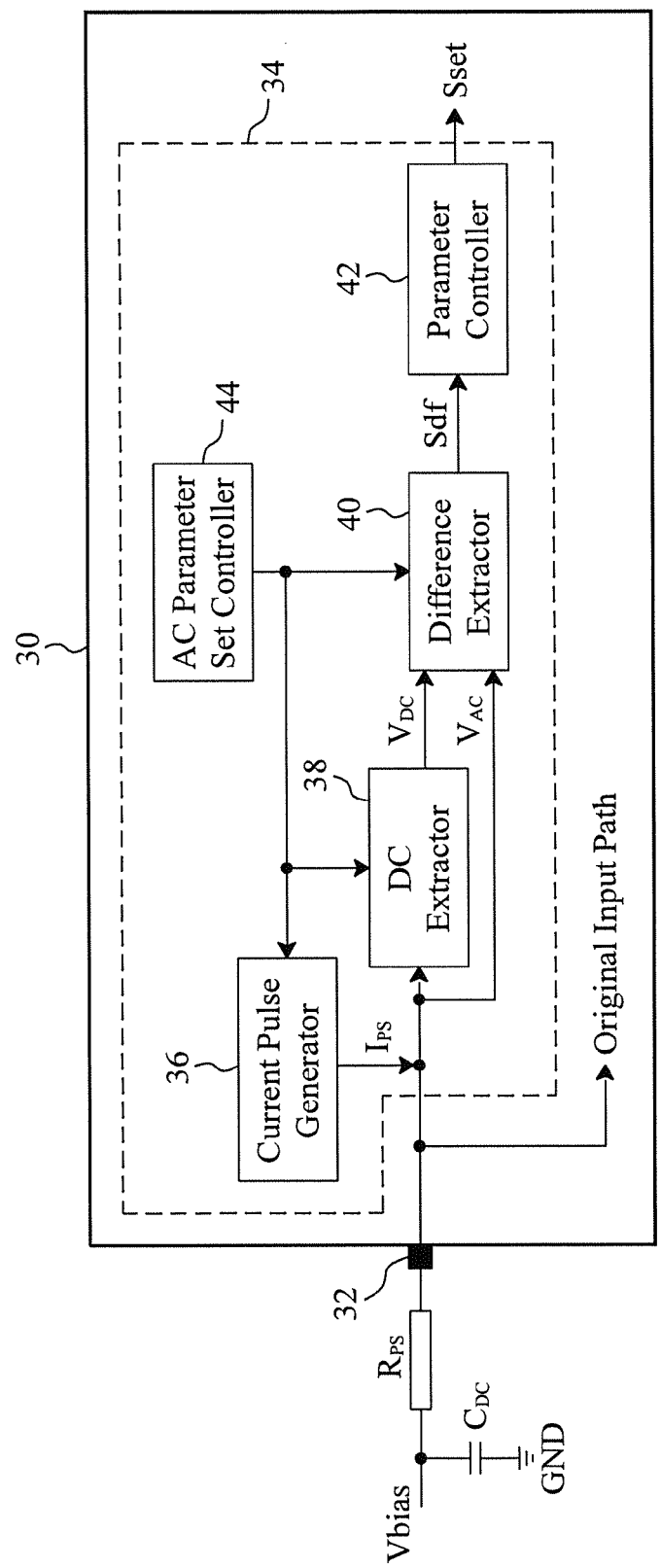
FIG. 4 is an embodiment according to the present invention.

FIG. 4 is a schematic diagram of an embodiment according to the present invention, in which an IC 30 has a programming mode and a normal mode. During the programming mode, an external resistor $R_{PS}$ is connected between a pin 32 of the IC 30 and a bias source Vbias to function as a programming device for costumers to adjust its resistance, and a capacitor $C_{DC}$ is connected between the bias source Vbias and ground GND to function as a direct-current (DC) voltage supply. The pin 32 may be an input pin, an output pin or an input/output pin. In other embodiments, if the bias source Vbias provides a DC voltage, the capacitor $C_{DC}$ may be discarded. In the IC 30, during the programming mode, a parameter setting circuit 34 may apply a pulse current $I_{PS}$ to the pin 32 by alternating-current (AC) approach, and then detect the voltage $V_{AC}$ on the pin 32 to identify the resistance of the resistor $R_{PS}$ to generate a setting signal Sset for parameter setting to the internal circuit of the IC 30, for example, the resistor R1, the capacitor C1, the capacitor C2 or the transconductance GM of the transconductance amplifier in the compensation circuit 12 shown in FIG. 2 to determine the parameter of the compensation circuit 12. If the IC 30 is a power IC, the programming mode may be performed during the soft-start of the IC 30. The parameter setting circuit 34 includes a current pulse generator 36, a DC extractor 38, a difference extractor 40, a parameter controller 42 and an AC parameter set controller 44. During the programming mode, the current pulse generator 36 provides the pulse current $I_{PS}$ applied to the resistor $RP_{PS}$ through the pin 32 to change the voltage $V_{AC}$ on the pin 32, the DC extractor 38 extracts the DC component of the voltage $V_{AC}$ to generate a signal $V_{DC}$, the difference extractor 40 generates a signal Sdf according to the difference between the voltage $V_{AC}$ and the signal $V_{DC}$, and the parameter controller 42 generates the setting signal Sset according to the signal Sdf. In the parameter controller 42, a mapping table may be preset to output the corresponding setting signal Sset according to the signal Sdf. If the signal Sdf is a digital one, the parameter controller 42 may include a digital-to-analog converter (DAC) to convert the signal Sdf into an analog setting signal Sset. The AC parameter set controller 44 enables the current pulse generator 36, the DC extractor 38 and the difference extractor 40 during the programming mode, so as to allow the parameter setting circuit 34 for parameter setting to the internal circuit of the IC 30. During the normal mode of the IC 30, the AC parameter set controller 44 disables the current pulse generator 36, the DC extractor 38 and the difference extractor 40, such that the pin 32 may be used for other functions than the internal parameter setting. For example, if the pin 32 is the input pin OPS shown in FIG. 1, during the normal mode, the pin 32 may perform over-current setting and power-off detection; if the pin 32 is the input pin REFIN shown in FIG. 3, during the normal mode, the pin 32 may be used to set a reference voltage; and if the pin 32 is an output or an input/output pin, its output will be a tri-state signal. The difference extractor 40 or the parameter controller 42 may store the signal Sdf or the setting signal Sset, so that the parameter controller 42 can keep on the setting signal Sset to control the parameter of the internal circuit even during the normal mode.

Figure 5:
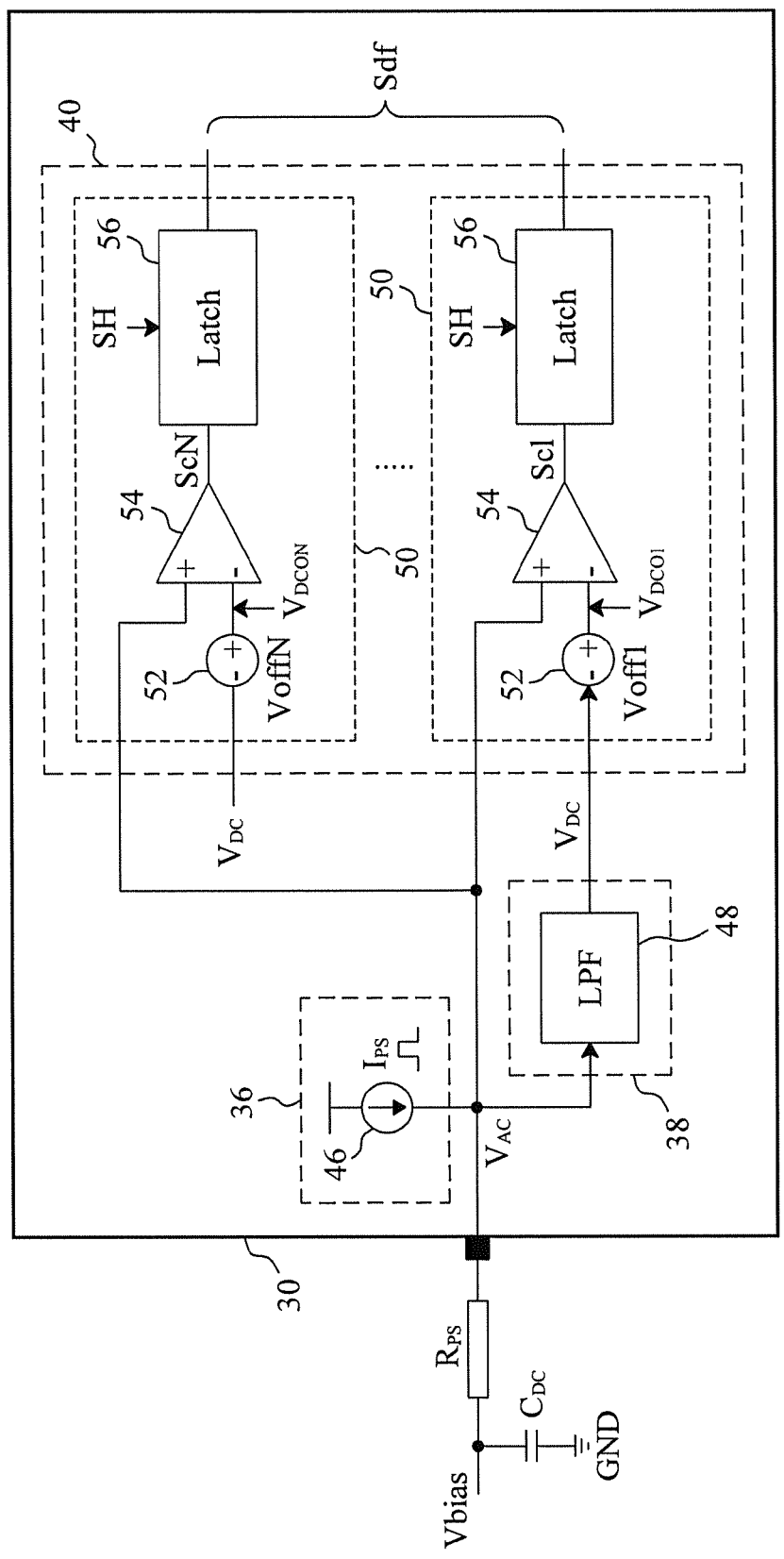
FIG. 5 is embodiment for the current pulse generator, DC extractor and difference extractor of the IC shown in FIG. 4.
Figure 6:
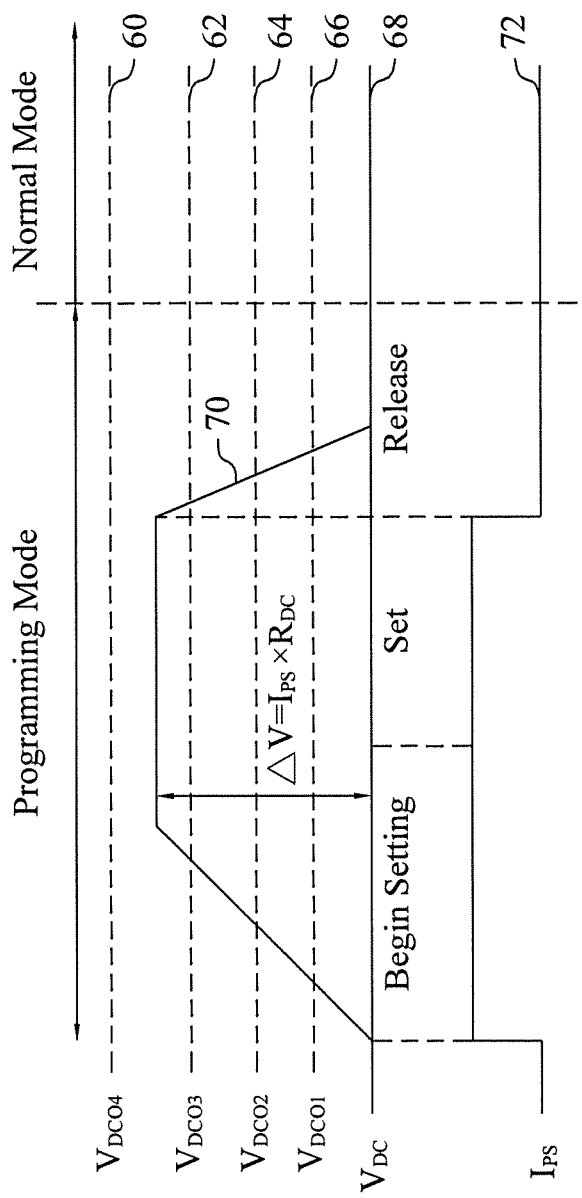
FIG. 6 is a waveform diagram of the circuit shown in FIG. 5.

FIG. 5 is an embodiment for the current pulse generator 36, the DC extractor 38 and the difference extractor 40 shown in FIG. 4. The current pulse generator 36 includes a current source 46 for providing the pulse current $I_{PS}$. The DC extractor 38 includes a low-pass filter (LPF) 48 for filtering the voltage $V_{AC}$ on the pin 32 to generate the signal $V_{DC}$. The difference extractor 40 includes a plurality of conversion circuits 50 to convert the difference between the signal $V_{DC}$ and the voltage $V_{AC}$ into the signal Sdf. Each conversion circuit 50 includes an offset circuit 52, a comparator 54 and a latch 56. The offset circuits 52 provide different offset voltages Voff1-VoffN, respectively, and thus the conversion circuits 50 offset the signal $V_{DC}$ to generate different signals $V_{DCO1}$-$V_{DCON}$, respectively. The comparators 54 compare the voltage $V_{AC}$ with the signal $V_{DCO1}$-$V_{DCON}$, respectively, to generate a plurality of comparison signals Sc1-ScN as the signal Sdf. The latches 56 sample and store the comparison signal Sc1-ScN responsive to a signal SH, respectively. After the IC 30 enters the normal mode, since the latches 56 store the signal Sdf, the parameter controller 42 will remain the setting signal Sset. FIG. 6 is a waveform diagram of the circuit shown in FIG. 5. Referring to FIG. 5 and FIG. 6, assuming that there are four conversion circuits 50, the signal $V_{DC}$ is offset to generate four signals $V_{DCO1}$-$V_{DCO4}$, as represented by waveforms 66, 64, 62 and 60. During the programming mode, the pulse current $I_{PS}$ as shown by waveform 72 changes the voltage $V_{AC}$ on the pin 32 as shown by waveform 70. At this time, due to the LPF 48, the signal $V_{DC}$ will almost have no changes, as shown by waveform 68, and between the voltage $V_{AC}$ and the signal $V_{DC}$, there is a difference $\Delta V = I_{PS} \times R_{PS}$. As shown by waveform 70, the voltage $V_{AC}$ is higher than the signal $V_{DCO3}$ and lower than the signal $V_{DCO4}$. Thus, the comparison signals Sc1, Sc2, Sc3 and Sc4 will be "1", "1", "1" and "0", respectively. The parameter controller 42 then determines the setting signal Sset according to the comparison result. In other embodiments, the latches 56 may be incorporated into the parameter controller 42.

Figure 7:
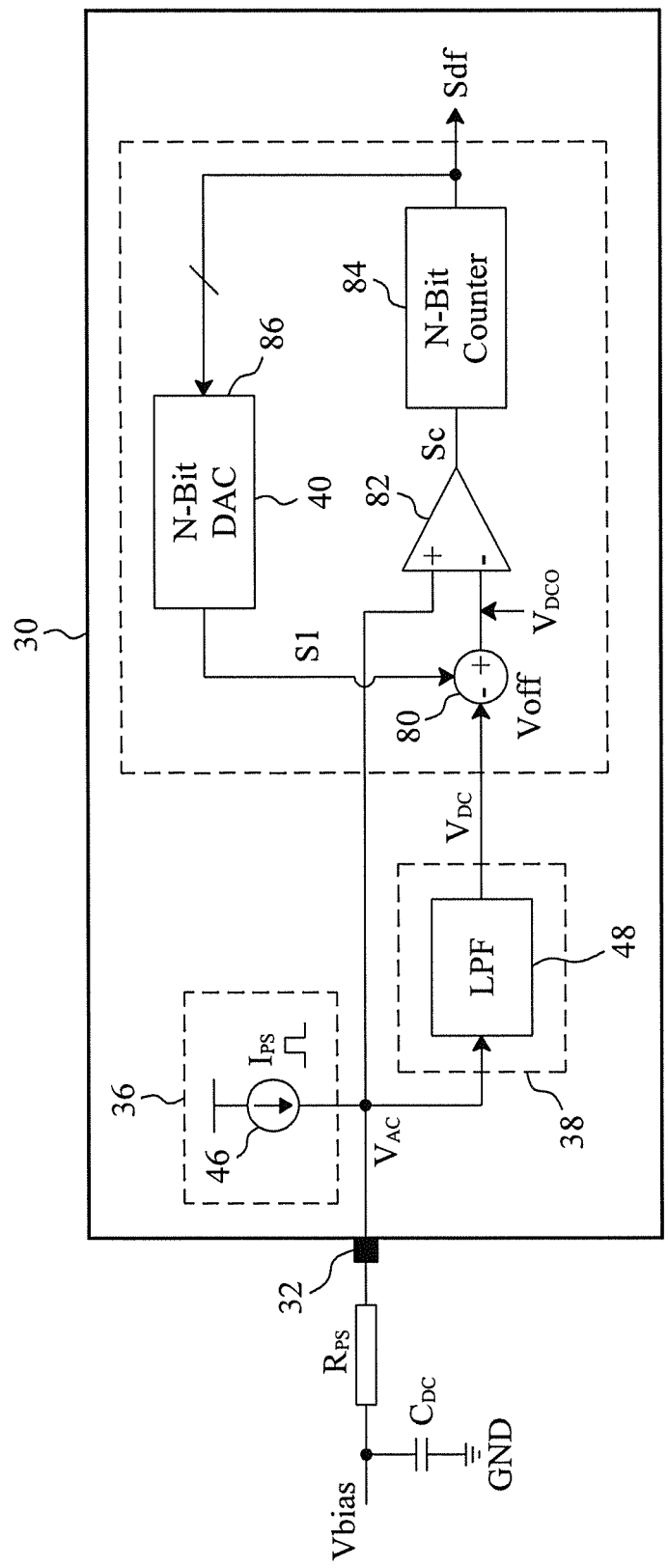
FIG. 7 shows another embodiment for the difference extractor of the IC shown in FIG. 4.

FIG. 7 is another embodiment for the difference extractor 40 shown in FIG. 4, which includes an offset circuit 80, a comparator 82, a counter 84 and a DAC 86. The offset circuit 80 determines an offset voltage Voff responsive to the signal S1 to offset the signal $V_{DC}$ to generate the signal $V_{DCO}$, the comparator 82 compares the voltage $V_{AC}$ with the signal $V_{DCO}$ to generate the comparison signal Sc, and the counter 84 increases or decreases the value of the signal Sdf responsive to the comparison signal Sc. In this embodiment, the signal Sdf is an N-bit digital signal, and the DAC 86 converts the signal Sdf into the signal S1. When the voltage $V_{AC}$ is higher than the signal $V_{DCO}$, the counter 84 increases the signal Sdf, thereby raising the offset voltage Voff provided by the offset circuit 80. When the voltage $V_{AC}$ is lower than the signal $V_{DCO}$, the counter 84 decreases the Sdf, thereby reducing the offset voltage Voff provided by the offset circuit 80. The counter 84 stores the signal Sdf to keep on the signal Sdf for the parameter controller 42 during the normal mode.

Figure 8:
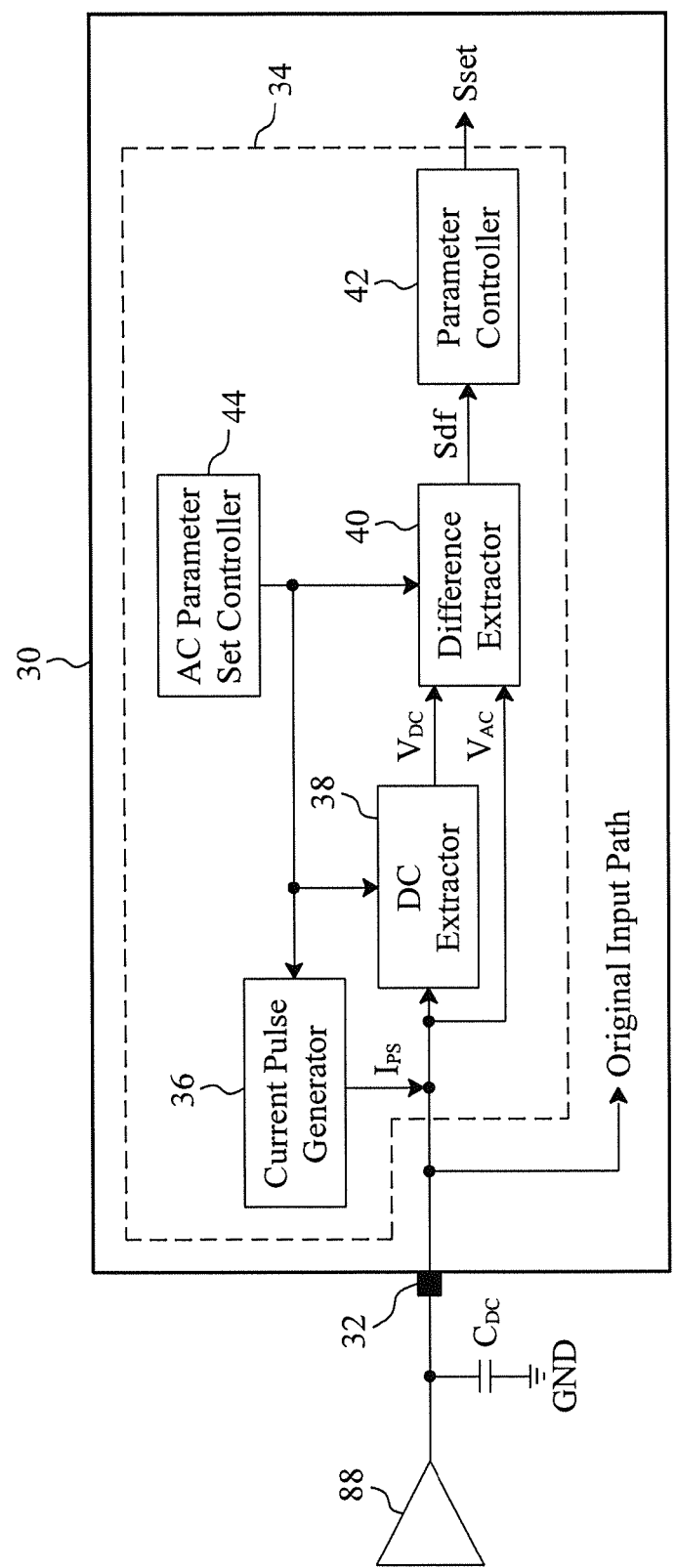
FIG. 8 is an application of the IC shown in FIG. 4 using an external capacitor as a programming device.

FIG. 8 is an application of the IC 30 shown in FIG. 4 using the capacitor $C_{DC}$ as a programming device. The parameter setting circuit 34 inside the IC 30 is similar to the embodiment of FIG. 4, while the capacitor $C_{DC}$ outside the IC 30 is connected between the pin 32 and ground GND. In this embodiment, the pin 32 is an input pin, so a tri-state buffer 88 is required. If the pin 32 is an output pin or an input/output pin, the output of the pin 32 will be a tri-state signal. In other embodiments, if there is bias voltage applied to the pin 32, a resistor will be additionally inserted between the buffer 88 and the capacitor $C_{DC}$.

Figure 9:
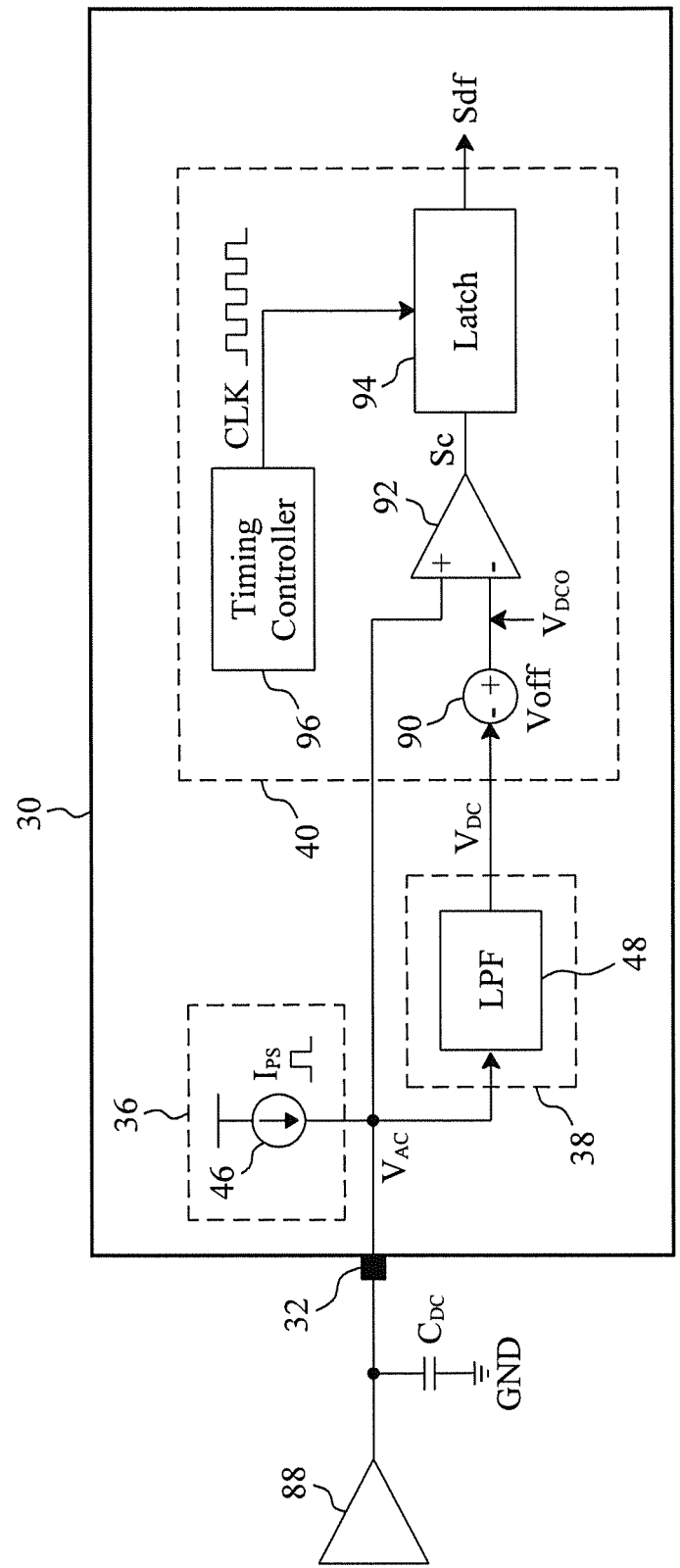
FIG. 9 shows an embodiment for the difference extractor of the circuit shown in FIG. 8.
Figure 10:
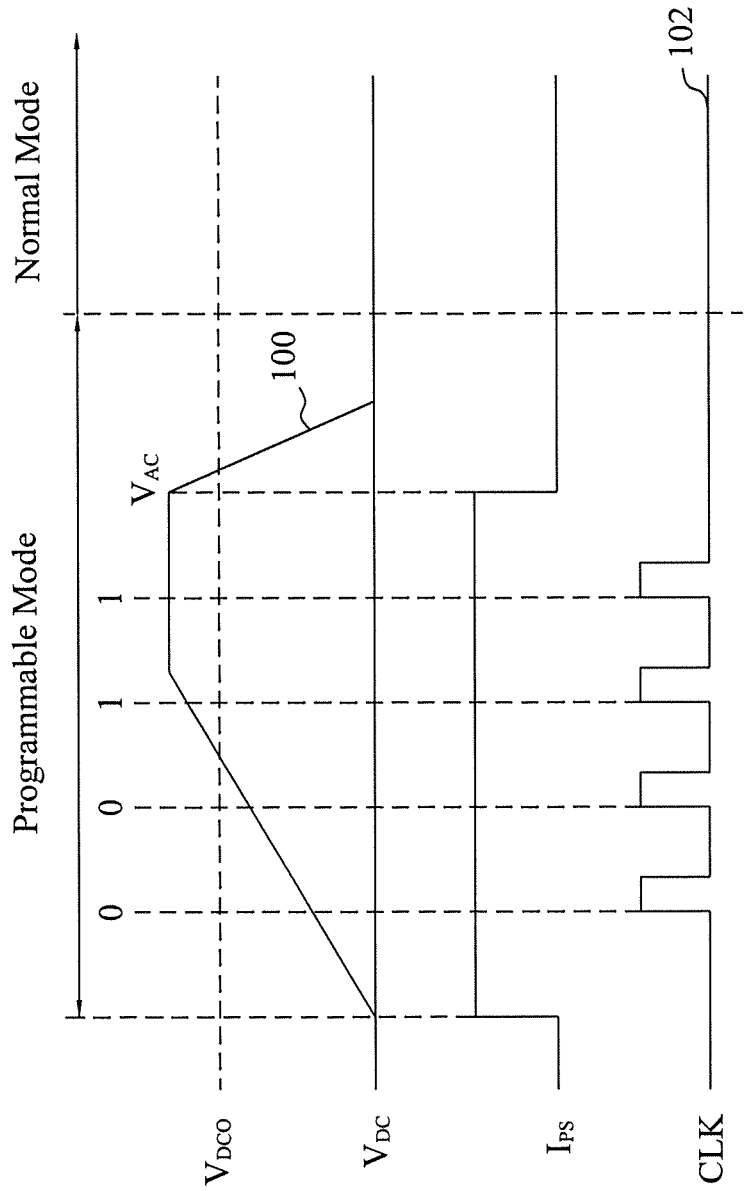
FIG. 10 is a waveform diagram of the circuit shown in FIG. 9.

FIG. 9 is an embodiment for the difference extractor 40 shown in FIG. 8, which includes an offset circuit 90, a comparator 92, a latch 94 and a timing controller 96. The offset circuit 90 provides an offset voltage Voff to offset the signal $V_{DC}$ to generate the signal $V_{DCO}$, the comparator 92 compares the voltage $V_{AC}$ with the signal $V_{DCO}$ to generate the comparison signal Sc, and the latch 94 samples the comparison signal Sc responsive to a clock CLK provided by the timing controller 96 to generate the signal Sdf for the parameter controller 42 to determine the setting signal Sset. The latch 94 may store the signal Sdf to keep on the signal Sdf for the parameter controller 42 during the normal mode. FIG. 10 is a waveform diagram of the circuit shown in FIG. 9. When the current pulse generator 36 applies the pulse current $I_{PS}$ to the capacitor $C_{DC}$ through the pin 32, the voltage $V_{AC}$ on the pin 32 increases, as shown by waveform 100. The comparator 92 compares the voltage $V_{AC}$ with the signal $V_{DCO}$, so that when the voltage $V_{AC}$ is lower than the signal $V_{DCO}$, the comparison signal Sc is low, and when the voltage $V_{AC}$ is higher than the signal $V_{DCO}$, the comparison signal Sc is high. The latch 94 samples the comparison signal Sc responsive to the clock CLK as shown by waveform 102 to generate the signal Sdf. According to the sampled result, the time when the voltage $V_{AC}$ becomes higher than the signal $V_{DCO}$ can be roughly determined, and in turn the capacitance of the capacitor $C_{DC}$ can be determined. Since the pulse current $I_{PS}$ is fixed, when the capacitance of the capacitor $C_{DC}$ changes, the rising slope of the voltage $V_{AC}$ changes correspondingly, so the sampled signal Sdf will be different. Thus, by changing the capacitance of the capacitor $C_{DC}$, the parameter to be set can be detected.

Figure 11:
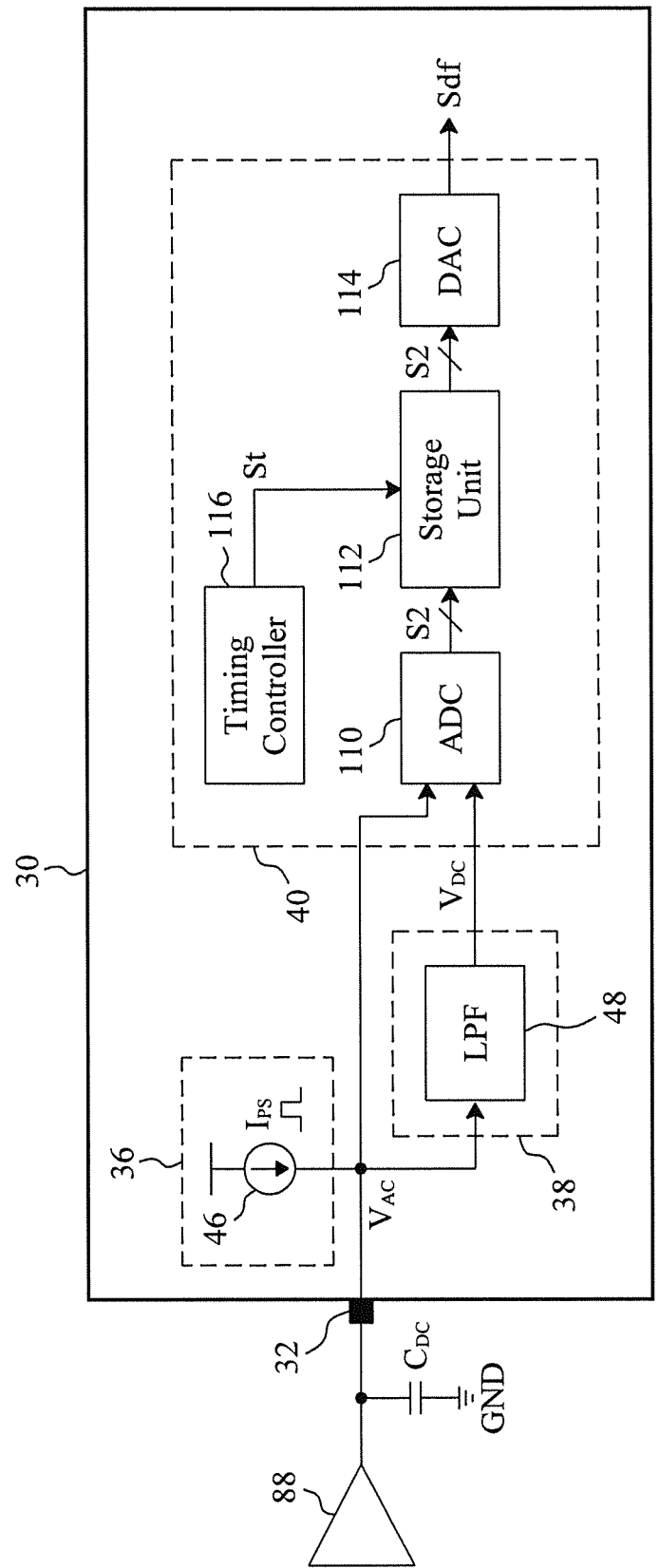
FIG. 11 shows another embodiment for the difference extractor of the circuit shown in FIG. 8.
Figure 12:
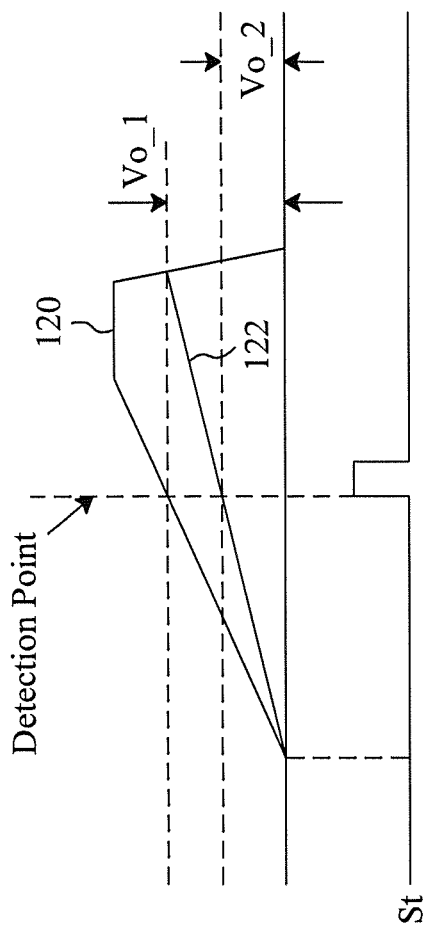
FIG. 12 is a waveform diagram of the circuit shown in FIG. 11.

FIG. 11 is another embodiment for the difference extractor 40 shown in FIG. 8, which includes an analog-to-digital converter (ADC) 110, a storage unit 112, a DAC 114 and a timing controller 116. The ADC 110 converts the difference between the voltage $V_{AC}$ and the signal $V_{DC}$ into a digital signal S2, the storage unit 112 stores the digital signal S2 responsive to a trigger signal St coming from the timing controller 116, and the DAC 114 converts the digital signal S2 stored by the storage unit 112 into the signal Sdf. FIG. 12 is a waveform diagram of the circuit shown in FIG. 11, in which waveforms 120 and 122 represent the voltage $V_{AC}$. Referring to FIG. 11 and FIG. 12, since the pulse current IPS is fixed, when the capacitance of the capacitor $C_{DC}$ changes, the rising slope of the voltage $V_{AC}$ changes correspondingly, as shown by waveforms 120 and 122, so the differences Vo_1 and Vo_2 stored by the storage unit 112 will be different. Thereby, the parameter controller 42 will alter the parameter according to the difference Vo_1 or Vo_2.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A parameter setting circuit inside an integrated circuit for providing a setting signal for parameter setting to an internal circuit of the integrated circuit, the parameter setting circuit comprising:
    a current pulse generator connected to a pin of the integrated circuit, enabled during a programming mode of the integrated circuit to apply a pulse current to the pin to change a voltage on the pin;
    a DC extractor connected to the pin, enabled during the programming mode to extract a DC component of the voltage on the pin to generate a first signal;
    a difference extractor connected to the pin and the DC extractor, enabled during the programming mode to extract a difference between the voltage on the pin and the first signal to generate a second signal; and
    a parameter controller connected to the difference extractor, determining the setting signal responsive to the second signal.

2. The parameter setting circuit of claim 1, wherein the DC extractor comprises a low-pass filter, filtering the voltage on the pin.

3. The parameter setting circuit of claim 1, wherein the difference extractor comprises a plurality of conversion circuits, converting the difference into the second signal.

4. The parameter setting circuit of claim 3, wherein each of the plurality of conversion circuits comprises:
    an offset circuit connected to the DC extractor, offsetting the first signal to generate a third signal;
    a comparator connected to the pin and the offset circuit, comparing the voltage on the pin with the third signal to generate a comparison signal; and
    a latch connected to the comparator, storing the comparison signal.

5. The parameter setting circuit of claim 1, wherein the difference extractor comprises:
    an offset circuit connected to the DC extractor, determining an offset voltage responsive to a third signal to offset the first signal to generate a fourth signal;
    a comparator connected to the pin and the offset circuit, comparing the voltage on the pin with the fourth signal to generate a comparison signal;
    a counter connected to the comparator, responsive to the comparison signal to adjust and store the second signal; and
    a digital-to-analog converter connected to the counter, responsive to the second signal to generate the third signal.

6. The parameter setting circuit of claim 1, wherein the difference extractor comprises:
    an offset circuit connected to the DC extractor, offsetting the first signal to generate a third signal;
    a comparator connected to the pin and the offset circuit, comparing the voltage on the pin with the third signal to generate a comparison signal; and
    a latch connected to the comparator, responsive to a clock to sample the comparison signal to generate and store the second signal.

7. The parameter setting circuit of claim 1, wherein the difference extractor comprises:
    an analog-to-digital converter connected to the pin and the DC extractor, converting the difference into a digital signal;
    a storage unit connected to the analog-to-digital converter, responsive to a trigger signal to store the digital signal output from the analog-to-digital converter; and
    a digital-to-analog converter connected to the storage unit, converting the digital signal stored by the storage unit into the second signal.

8. The parameter setting circuit of claim 1, wherein the parameter controller has a mapping table for determining the setting signal responsive to the second signal.

9. The parameter setting circuit of claim 1, wherein the parameter controller comprises a digital-to-analog converter connected to the difference extractor, converting the second signal into an analog signal from a digital signal.

10. A parameter setting method for providing a setting signal for parameter setting to an internal circuit of an integrated circuit, the parameter setting method comprising the steps of:
    (A) during a programming mode of the integrated circuit, applying a pulse current to a pin of the integrated circuit which is connected with a programming device outside the integrated circuit;
    (B) during the programming mode of the integrated circuit, extracting a DC component of a voltage on the pin to generate a first signal;
    (C) during the programming mode of the integrated circuit, generating a second signal according to a difference between the voltage on the pin and the first signal; and
    (D) determining the setting signal responsive to the second signal.

11. The parameter setting method of claim 10, wherein the step B comprises the step of filtering the voltage on the pin to generate the first signal.

12. The parameter setting method of claim 10, wherein the step C comprises the steps of:
    offsetting the first signal with a plurality of different offset voltages to generate a plurality of third signals;
    comparing the voltage on the pin with each of the plurality of third signal to generate a plurality of comparison signals as the second signal; and
    storing the second signal.

13. The parameter setting method of claim 10, wherein the step C comprises the steps of:
    determining an offset voltage responsive to a third signal to offset the first signal to generate a fourth signal;
    comparing the voltage on the pin with the fourth signal to generate a comparison signal;
    adjusting the second signal responsive to the comparison signal;
    storing the second signal; and
    generating the third signal responsive to the second signal.

14. The parameter setting method of claim 10, wherein the step C comprises the steps of:
    providing an offset voltage to offset the first signal to generate a third signal;
    comparing the voltage on the pin with the third signal to generate a comparison signal;
    sampling the comparison signal responsive to a clock to generate the second signal; and
    storing the second signal.

15. The parameter setting method of claim 10, wherein the step C comprises the steps of:
    converting the difference into a digital signal;
    storing the digital signal after a preset time period; and
    converting the stored digital signal into the second signal.

16. The parameter setting method of claim 10, wherein the step D comprises the step of determining the setting signal according to the second signal and a mapping table.

17. The parameter setting method of claim 10, wherein the step D comprises the step of converting the second signal into an analog signal.

18. The parameter setting method of claim 10, further comprising the step of connecting a resistor to the pin as the programming device.

19. The parameter setting method of claim 10, further comprising the step of connecting a capacitor to the pin as the programming device.

* * * * *